US008859334B2

(12) United States Patent
Kubota et al.

(10) Patent No.: US 8,859,334 B2
(45) Date of Patent: Oct. 14, 2014

(54) ELECTRONIC DEVICE MANUFACTURING METHOD AND CHIP ASSEMBLY

(71) Applicant: Fujitsu Limited, Kawasaki (JP)

(72) Inventors: Hajime Kubota, Kawasaki (JP); Masayuki Itoh, Kawasaki (JP); Masakazu Kishi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 14/030,694

(22) Filed: Sep. 18, 2013

(65) Prior Publication Data

US 2014/0015114 A1    Jan. 16, 2014

Related U.S. Application Data

(63) Continuation of application No. PCT/JP2011/056649, filed on Mar. 18, 2011.

(51) Int. Cl.
| | | |
|---|---|---|
| *H01L 21/00* | (2006.01) | |
| *H01L 21/302* | (2006.01) | |
| *H01L 23/00* | (2006.01) | |
| *H01L 21/02* | (2006.01) | |
| *H01L 23/58* | (2006.01) | |
| *H03H 3/08* | (2006.01) | |

(52) U.S. Cl.
CPC ........ *H01L 21/02076* (2013.01); *H01L 21/302* (2013.01); *H01L 23/00* (2013.01); *H03H 3/08* (2013.01); *H01L 23/58* (2013.01); *Y10S 438/977* (2013.01)
USPC ........... 438/107; 438/977; 438/753; 438/455; 438/457; 438/464; 257/620

(58) Field of Classification Search
USPC ......... 438/977, 753, 455, 456, 457, 464, 479, 438/107; 257/620
See application file for complete search history.

(56) References Cited

U.S. PATENT DOCUMENTS

| | | | | |
|---|---|---|---|---|
| 6,562,127 | B1 * | 5/2003 | Kud et al. | ........................ 117/94 |
| 6,818,529 | B2 * | 11/2004 | Bachrach et al. | ............. 438/455 |

(Continued)

FOREIGN PATENT DOCUMENTS

| | | |
|---|---|---|
| JP | 04-087408 A | 3/1992 |
| JP | 10-056349 A | 2/1998 |

(Continued)

OTHER PUBLICATIONS

International Search Report of PCT/JP2011/056649, mailing date of May 10, 2011.

*Primary Examiner* — Jarrett Stark
*Assistant Examiner* — Mohammad M Hoque
(74) *Attorney, Agent, or Firm* — Westerman, Hattori, Daniels & Adrian, LLP

(57) ABSTRACT

An electronic device manufacturing method includes a cutting step at which a wafer is cut to obtain chips before pattern formation and a polishing step at which cut surfaces of the obtained chips are subjected in one batch to barrel polishing. The method further includes an aligning step at which the polished chips are aligned so that front surfaces thereof face in an upward direction. The method further includes a bonding step at which the cut surfaces of the aligned chips are bonded together with an adhesive to thereby form a chip assembly. The method further includes a pattern forming step at which a circuit pattern is formed on each of the chips of the chip assembly and a melting step at which the adhesive on the chip assembly is melted to thereby separate the chip assembly into chips after pattern formation.

4 Claims, 10 Drawing Sheets

(56) References Cited

U.S. PATENT DOCUMENTS

| | | |
|---|---|---|
| 2004/0140206 A1* | 7/2004 | Voutsas et al. ............ 204/298.13 |
| 2005/0020175 A1* | 1/2005 | Tamashiro et al. ............. 445/24 |
| 2006/0197619 A1* | 9/2006 | Oishi et al. .................... 331/158 |
| 2009/0280622 A1* | 11/2009 | Genda et al. .................. 438/462 |

FOREIGN PATENT DOCUMENTS

| | | |
|---|---|---|
| JP | 11-288881 A | 10/1999 |
| JP | 2002-198328 A | 7/2002 |
| JP | 2009-117902 A | 5/2009 |

\* cited by examiner (A)

(B)

(C)

ELECTRONIC DEVICE MANUFACTURING METHOD AND CHIP ASSEMBLY

CROSS-REFERENCE TO RELATED APPLICATION

This application is a continuation of International Application No. PCT/JP2011/056649, filed on Mar. 18, 2011, the entire contents of which are incorporated herein by reference.

FIELD

The embodiments discussed herein are related to electronic device manufacturing methods, electronic devices, and chip assemblies.

BACKGROUND

Electronic devices, such as integrated circuits, are manufactured by, for example, forming wire traces and other circuit patterns on thin slices of chips cut from a silicon or other wafer. FIG. 10 illustrates an example method for manufacturing electronic devices. Referring to FIG. 10(A), rectangular chips 110, each having a predetermined size, are segmented on a front surface of a wafer 100. Additionally, as illustrated in FIG. 10(B), a pattern forming apparatus not illustrated is employed to cause a front surface of each of the chips 110 segmented into the predetermined size to be subjected to a patterning. This forms a circuit pattern 111, such as a wire trace pattern, on the front surface of each of the chips 110 of the wafer 100.

In addition, referring to FIG. 10(c), a dicing apparatus not illustrated is employed to cut the wafer 100 into the chips 110, thereby obtaining the chips 110 with patterns formed thereon. This results in the circuit pattern 111 being formed on the front surface of each of the chips 110 and each chip 110 divided by the cutting serving as an electronic device 112. Conventional examples are described in Japanese Laid-open Patent Publication No. 10-56349, Japanese Laid-open Patent Publication No. 04-87408, and Japanese Laid-open Patent Publication No. 11-288881.

The method for manufacturing the electronic device 112, however, involves burr formed on a cut surface 110A of the chip 110 during the step of cutting of the chip 110 on which the pattern is formed from the wafer 100. FIG. 11 illustrates an example external configuration of the electronic device 112 manufactured through the manufacturing method illustrated in FIGS. 10(A) to 10(C). Specifically, as illustrated in FIG. 11, the burr X is formed on the cut surface 110A of the chip 110 during the step of cutting of the chip 110 on which the pattern is formed from the wafer 100. The burr X on the chip 110 formed during the step of cutting may make a foreign object when, for example, the chip 110 is encapsulated in a synthetic resin or other package. In this case, the burr X on the chip 110 sticks to the circuit pattern 111 on the front surface of the chip 110, thus causing the circuit to be short-circuited, which may make the electronic device 112 a reject.

Understandably, the burr X formed on the cut surface 110A of the chip 110 may be removed. Individually polishing the chip 110 on which the pattern is formed may be, for example, one possible way to remove the burr X from the chip 110. It is, however, important to pay attention to the chip 110 after pattern formation so as not to damage the circuit pattern 111 formed on the front surface of the chip 110 during removal of the burr X. This requires a large workload during the removal of the burr X. Specifically, removing the burr X on the chips 110 altogether without damaging the circuit patterns 111 is a difficult task to perform.

Accordingly, it is an object in one aspect of an embodiment of the invention is to provide an electronic device manufacturing method, an electronic device, and a chip assembly that permit burr to be removed from a plurality of chips altogether.

According to an aspect of an embodiment, an electronic device manufacturing method includes: cutting a wafer to obtain chips on which patterns are yet to be formed; polishing cut surfaces of the obtained chips in one batch; and forming patterns on the polished chips.

SUMMARY

According to an aspect of an embodiment, a method for manufacturing an electronic device includes cutting a wafer to obtain chips before pattern formation. The method includes polishing a cut surface of each of the obtained chips in one batch. The method includes bonding together the cut surfaces of the polished chips with an adhesive and forming a pattern on each of the chips bonded together.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Preferred embodiments of the present invention will be explained with reference to accompanying drawings.

The embodiments are not intended to limit or define the scope of the present invention.

[a] First Embodiment

Figure 1:
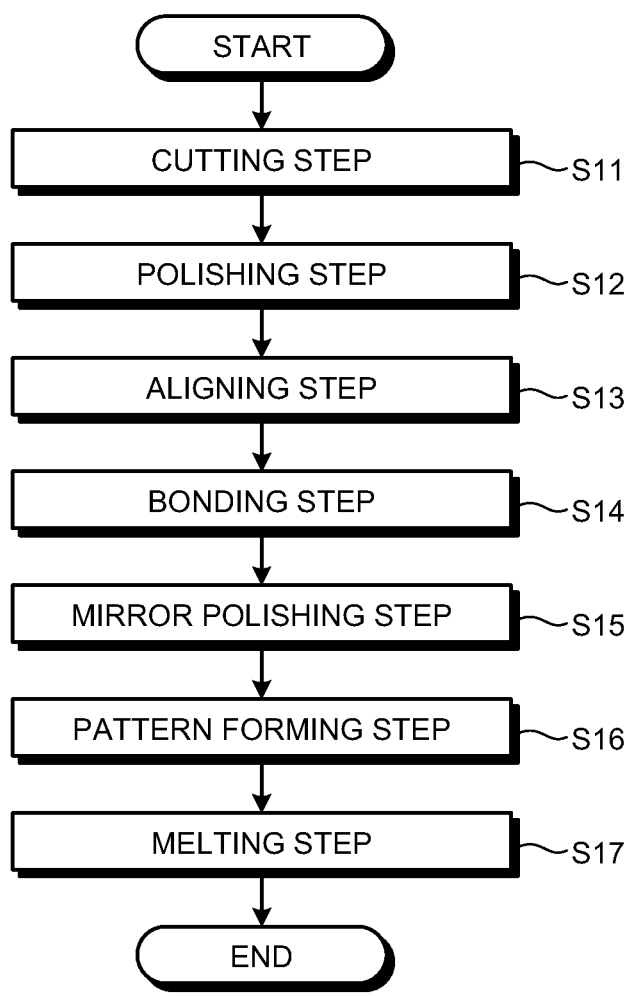
FIG. 1 is a flowchart illustrating an example electronic device manufacturing method according to a first embodiment.
Figure 2:
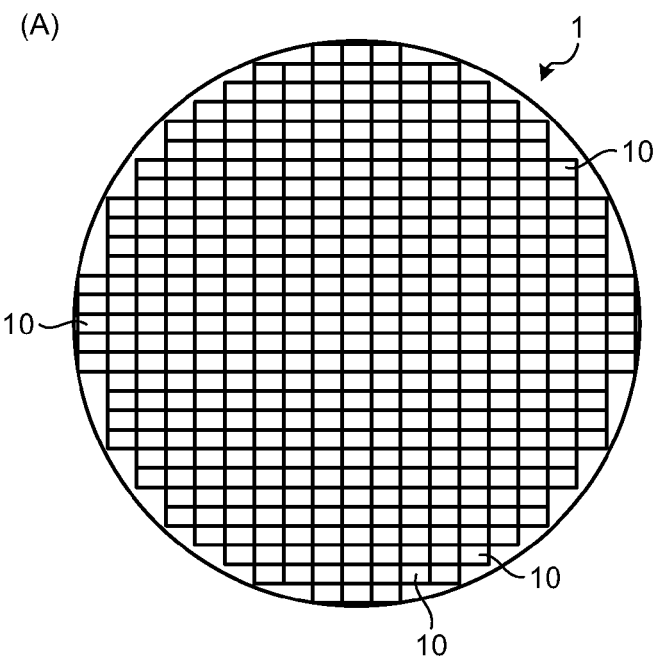
FIG. 2 is a diagram illustrating example steps of cutting and polishing according to the first embodiment.
Figure 2:
Figure 2:
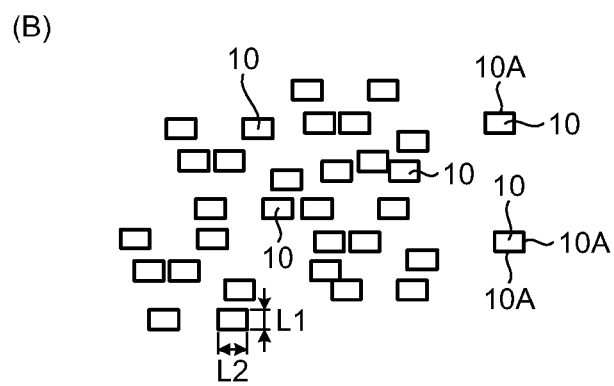
Figure 2:
Figure 2:
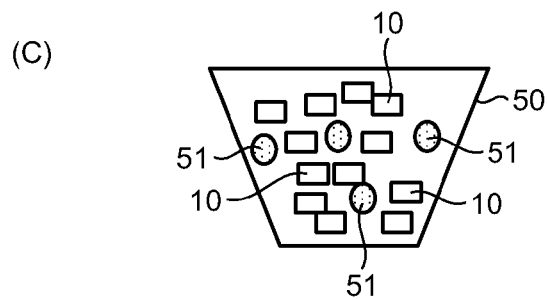

FIG. 1 is a flowchart illustrating an example electronic device manufacturing method according to a first embodiment. FIG. 2 is a diagram illustrating example steps of cutting and polishing according to the first embodiment. An electronic device according to the first embodiment is, for example, a chip on which a circuit pattern is formed, such as, a surface-acoustic-wave (SAW) filter. The electronic device manufacturing method illustrated in FIG. 1 performs a cutting step at which a wafer 1 is cut to obtain a chip 10 before pattern formation as illustrated in FIGS. 2(A) and 2(B) (Step S11). The cutting step is performed by, for example, a cutting apparatus, such as a dicing apparatus not illustrated. As illustrated in FIG. 2(A), the cutting apparatus, such as the dicing apparatus, cuts the crystal wafer 1 that is segmented into rectangles, each having a predetermined size. As a result, the cutting step obtains chips 10 before pattern formation, each having the same predetermined size, as illustrated in FIG. 2(B). The chip 10 of the predetermined size may, for example, have a vertical dimension L1 of 2 mm, a horizontal dimension L2 of 4 mm, and a height dimension of 1 mm.

Figure 3:
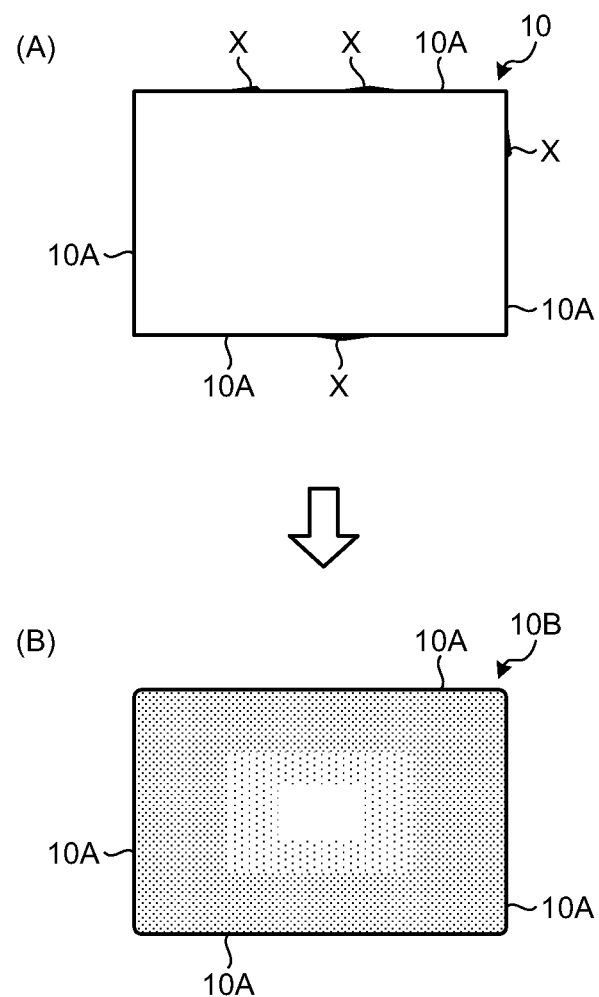
FIG. 3 is a diagram illustrating example external configurations of a chip according to the first embodiment.

In addition, the manufacturing method according to the first embodiment performs a polishing step at which cut surfaces 10A of the chips 10 obtained at the cutting step of Step S11 are polished in one batch (Step S12). The polishing step is performed by, for example, a polishing apparatus, such as a barrel polishing machine. When the chips 10 obtained at the cutting step of Step S11 are loaded in a polishing barrel 50 as illustrated in FIG. 2(C), the polishing apparatus, such as the barrel polishing machine performs barrel polishing of the chips 10 loaded in the polishing barrel 50. The polishing machine works as follows. For example, abrasive grains 51, the chips 10, a compound that serves as a cleaning agent, and water are mixed at a predetermined ratio and loaded in the polishing barrel 50 and the polishing machine polishes the chips 10 through friction between the chips 10 and the abrasive grains 51. This allows the polishing step to remove burr and cutting chips produced during the cutting step for the wafer 1 from the cut surfaces 10A of the chips 10. FIG. 3 illustrates external configurations of the chip 10 according to the first embodiment. FIG. 3(A) illustrates the chip 10 before the polishing step. Burrs X are produced on the cut surfaces 10A of the chip 10 during the cutting step. Thus, the polishing step performs barrel polishing of the chip 10. FIG. 3(B) illustrates a chip 10B after the polishing step. The polishing step removes the burr X formed on the cut surfaces 10A of the chip 10 and causes edges and corners of the chip 10 to be rounded. Adjusting a mixing ratio of the abrasive grains 51, the chips 10, the compound, and the water to be loaded in the polishing barrel 50 allows a polishing amount and a rounding amount of the chips 10 to be adjusted at the polishing step.

Figure 4:
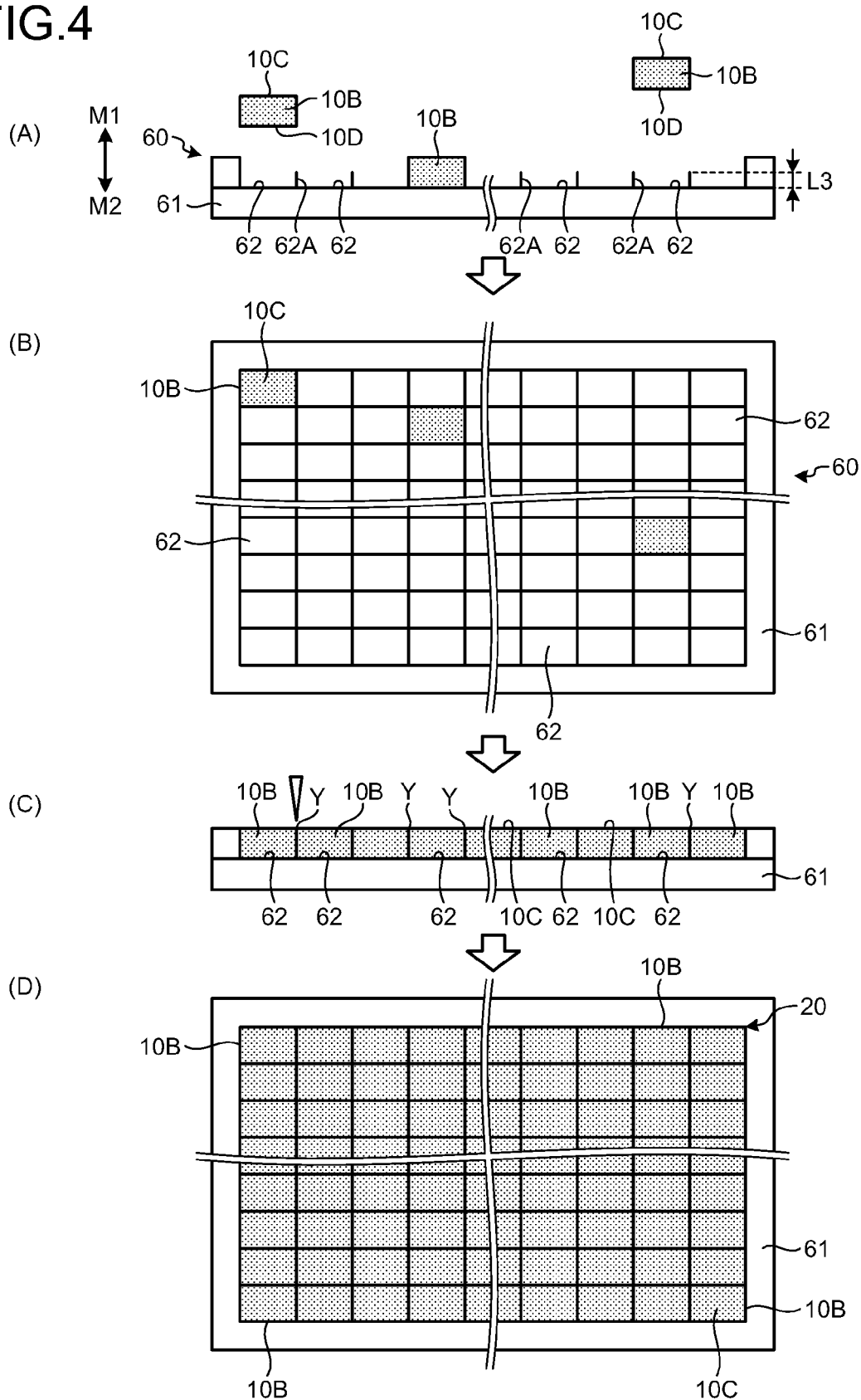
FIG. 4 is a diagram illustrating example steps of aligning and bonding according to the first embodiment.

The manufacturing method according to the first embodiment performs an aligning step at which the chips 10B that are polished at the polishing step of Step S12 are aligned so that intended surfaces thereof on which circuit patterns 15 are to be formed face in the same direction (Step S13). FIG. 4 illustrates example steps of aligning and bonding according to the first embodiment. The aligning step is performed by, for example, an automatic aligning machine 60. The automatic aligning machine 60 orients the intended surface, such as a front surface 10C, of the chip 10B that has undergone the barrel polishing at the polishing step of Step S12 in an upward direction M1 to thereby align the chip 10B. As illustrated in FIG. 4(A), the automatic aligning machine 60 includes, for example, a tray 61 that has a plurality of compartments 62 defined therein, each compartment 62 housing therein the aligned chip 10B. Each of the compartments 62 has a partition frame 62A that defines a boundary between two adjacent compartments 62, the partition frame 62A positioning the chip 10B inside each compartment 62. The partition frame 62A has a height dimension L3 of about half the height dimension of the chip 10B (1 mm), specifically, about 0.5 mm. As illustrated in FIGS. 4(A) and 4(B), each of the compartments 62 houses therein the chip 10B in a state where the front surface 10C of the chip 10B faces in the upward direction M1 and a reverse surface 10D of the chip 10B faces in a downward direction M2.

When conveying the polished chips 10B onto the compartments 62 inside the tray 61, the automatic aligning machine 60 houses the chips 10B in the compartments 62 of the tray 61 in sequence, while properly aligning the front surfaces 10C and the reverse surfaces 10D of the chips 10B so that the front surfaces 10C of the chips 10B face in the upward direction M1. By housing the chips 10B in the compartments 62 of the tray 61 in sequence so that the front surfaces 10C of the chips 10B face in the upward direction M1, the automatic aligning machine 60 aligns the chips 10B so that the front surfaces 10C of the chips 10B form a substantially identical plane.

Figure 5:
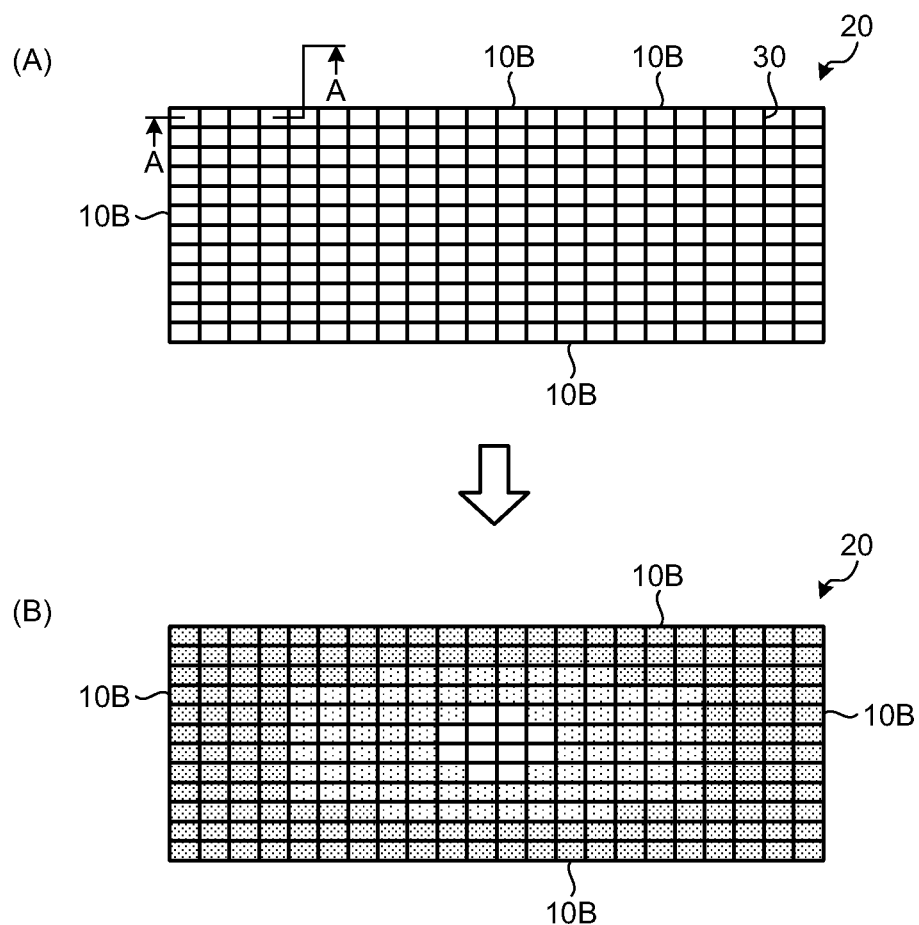
FIG. 5 is a diagram illustrating example steps of bonding and mirror polishing according to the first embodiment.
Figure 6:
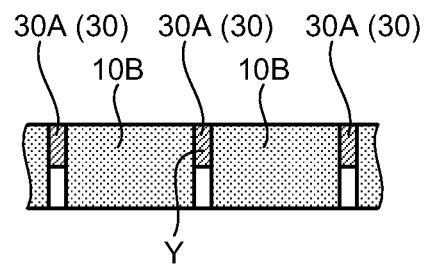
FIG. 6 is a partly cutaway, cross-sectional view taken along line A-A of FIG. 5(A)

The manufacturing method according to the first embodiment further performs a bonding step at which the cut surfaces 10A of the chips 10B aligned at the aligning step of Step S13 are bonded to each other with an adhesive 30 (Step S14). The bonding step is performed by, for example, the automatic aligning machine 60. When the chips 10B aligned at the aligning step of Step S13 are housed in all of the compartments 62 in the tray 61, the automatic aligning machine 60 applies the adhesive 30 to each gap Y between the cut surfaces 10A of the adjacent stored chips 10B, as illustrated in FIGS. 4(C) and 4(D). The automatic aligning machine 60 thus applies the adhesive 30 to the gap Y, thereby bonding together the cut surfaces 10A of the adjacent chips 10B. FIG. 5 illustrates example steps of bonding and mirror polishing according to the first embodiment. The adhesive 30 is, for example, a thermoplastic hot melt adhesive that can be melted. FIG. 6 is a partly cutaway, cross-sectional view taken along line A-A of FIG. 5(A). When the adhesive 30 is applied to the gap Y at the boundary portion between the chips 10B housed in the tray 61, the partition frame 62A of the compartment 62 exists in the gap Y between the chips 10B. As a result, at the bonding step, bonding together the cut surfaces 10A of the chips 10B aligned to each other with the adhesive 30 forms a chip assembly 20 as illustrated in FIG. 5(A). The chip assembly 20 can be removed from the tray through suction or turnover of the tray 61.

Referring to FIG. 6, the chip assembly 20 is formed by bonding together the cut surfaces 10A of the chips 10B with the adhesive 30 applied to the gap Y between the adjacent chips 10B. The thickness of an adhesive layer 30A that bonds the chips 10B in the chip assembly 20 is adjusted according to the height of the partition frame 62A in the gap Y. Thus, setting the height dimension L3 of the partition frame 62A to a value less than the height dimension of the chip 10B and increasing the height dimension L3 of the partition frame 62A causes the thickness of the adhesive layer 30A to be thinner, allowing the amount of the adhesive 30 used to be saved.

The manufacturing method according to the first embodiment performs a mirror polishing step at which the intended surfaces, such as the front surfaces 10C, of the chips 10B bonded together at the bonding step of Step S14 are polished (Step S15). The mirror polishing step is performed by, for example, a mirror polishing machine not illustrated. The mirror polishing machine performs mirror polishing of a front surface and a reverse surface of the chip assembly 20 formed at the bonding step of Step S14. It is noted that, as illustrated in FIG. 5(B), the mirror polishing step is intended to flatten irregularities of the front surface and the reverse surface of the chip assembly 20 and thereby mirror-polish these surfaces.

As a result, at the mirror polishing step, the front surface 10C and the reverse surface 10D of each of the chips 10B of the chip assembly 20 are flattened, so that accuracy with which the circuit pattern 15 is formed can be improved.

Figure 7:
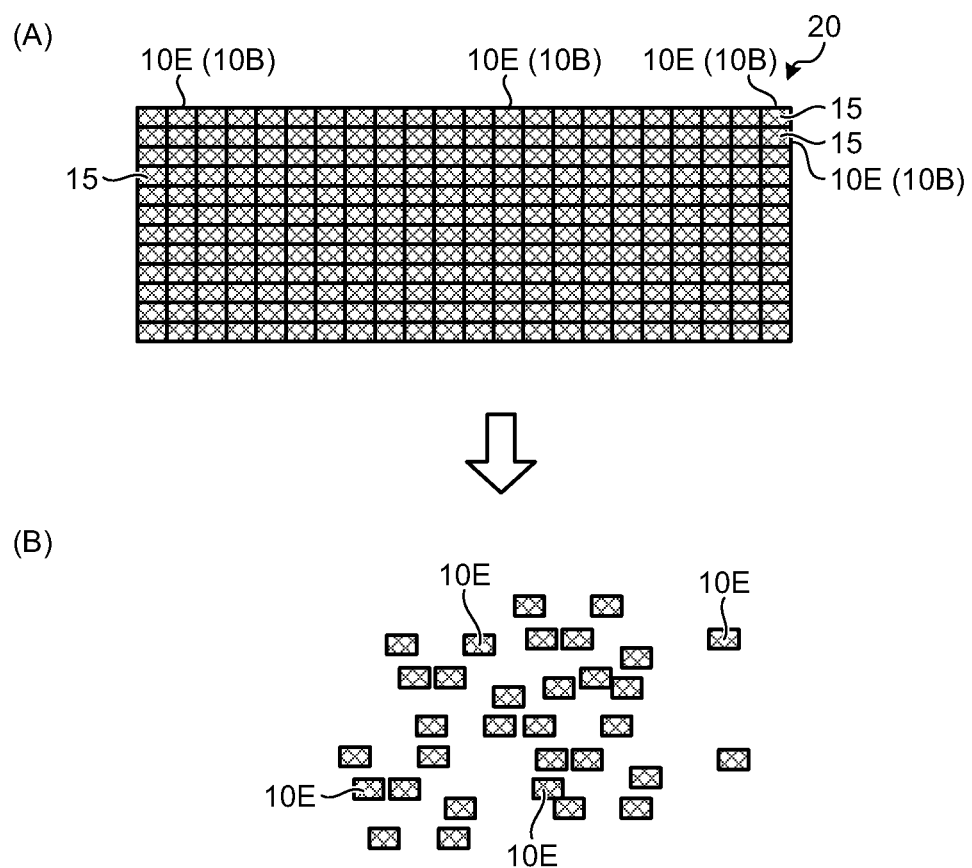
FIG. 7 is a diagram illustrating example steps of pattern forming and melting according to the first embodiment.

The manufacturing method according to the first embodiment performs a pattern forming step at which the circuit patterns 15 are formed on the intended surfaces, such as the front surfaces 10C, of the chips 10B in the chip assembly 20 that is mirror-polished at the mirror polishing step of Step S15 (Step S16). The pattern forming step is performed by, for example, a pattern forming apparatus not illustrated. FIG. 7 illustrates example steps of pattern forming and melting according to the first embodiment. As illustrated in FIG. 7(A), the pattern forming apparatus forms the circuit pattern 15 of the SAW filter on the front surface 10C of each of the chips 10B of the chip assembly 20 that is mirror-polished at the mirror polishing step of Step S15.

The pattern forming apparatus, for example, applies resist to the front surface 10C of each of the chips 10B of the chip assembly 20. In addition, the pattern forming apparatus sets an optical mask on the front surface 10C to which the resist is applied and exposes the optical mask to thereby transfer the circuit pattern 15 of the SAW filter onto the resist. The pattern forming apparatus further selectively removes unnecessary resist from the front surface 10C of each of the chips 10B of the chip assembly 20 through developing. The pattern forming apparatus deposits a thin film of an inter-digital transducer (IDT) of a SAW filter resonator on the entire surface of the front surface 10C from which the unnecessary resist is removed. The pattern forming apparatus then uses, for example, a chemical agent to remove an unnecessary portion of an electrode thin film together with the resist. In forming the circuit pattern 15, the pattern forming apparatus repeats a series of these operations. This results in the circuit pattern 15 of the SAW filter being formed on the front surface 10C of each of the chips 10B of the chip assembly 20. Each of the chips 10B of the chip assembly 20 is a chip 10E after pattern formation.

In addition, the manufacturing method according to the first embodiment performs a melting step at which the adhesive 30 that bonds together the chips 10E on which the circuit patterns 15 are formed is melted (Step S17). The melting step is performed by, for example, a heating apparatus not illustrated. The heating apparatus melts the adhesive 30 of the chip assembly 20 that has undergone the pattern forming step at Step S16 to thereby separate the chip assembly 20 into the chips 10E after pattern formation. The chips 10E after pattern formation are electronic devices. With the thermoplastic resin adhesive 30, for example, the heating apparatus melts to remove the adhesive 30 between the chips 10E by sufficiently heating the adhesive 30 to a melting temperature. By melting to remove the adhesive 30 from the chip assembly 20, the heating apparatus separates the chip assembly 20 into the chips 10E after pattern formation as illustrated in FIG. 7(B). This results in each of the chips 10E after pattern formation in the chip assembly 20 being an electronic device. At the melting step, the heating apparatus is employed to sufficiently heat the adhesive 30 to its melting temperature and melt and remove the adhesive 30. To remove the adhesive 30 completely, heating time at the melting temperature may be set to be longer, or a chemical agent may be employed to remove the thermoplastic resin.

As described heretofore, in the electronic device manufacturing method according to the first embodiment, the chips 10 before pattern formation cut from the wafer 1 are subjected to barrel polishing in one batch. This manufacturing method involves the chips 10 before pattern formation being subjected to the barrel polishing, so that the burr X and cutting chips produced on the cut surfaces 10A of the chips 10 during the cutting of the wafer can be removed in one batch without damaging the circuit patterns 15. Thus, the manufacturing method can, for example, prevent rejects of electronic devices caused by the burr X or the cutting chips from being generated and improve a manufacturing yield of the electronic devices.

In the electronic device manufacturing method according to the first embodiment, the burr X on the cut surfaces 10A of the chips 10 are removed by barrel polishing after the performance of the cutting step. The cutting step can be performed at an increased cutting speed without any fear of possible burr X. As a result, the cutting step at an increased speed of cutting the wafer 1 can be employed, so that manufacturing efficiency can be improved, while a general manufacturing speed of electronic devices is being increased.

In addition, in the electronic device manufacturing method according to the first embodiment, the automatic aligning machine 60 is employed to align the chips 10B before pattern formation so that the front surfaces 10C of the polished chips 10B face in the upward direction M1. In the manufacturing method, when the chips 10B before pattern formation are aligned, the adhesive 30 that can be melted is applied to the gap Y between the aligned chips 10B to thereby bond together the cut surfaces 10A of the chips 10B, thus forming the chip assembly 20. As a result, this manufacturing method can provide the chip assembly 20, in which the chips 10B before pattern formation are aligned and the burr X formed during wafer cutting is removed from the cut surfaces 10A of the chips 10. Specifically, the chip assembly 20 is formed of the aligned chips 10B before pattern formation. This enables the pattern forming step of forming the circuit patterns 15 for the chips 10B in the chip assembly 20 to be performed efficiently.

The electronic device manufacturing method according to the first embodiment flattens irregularities of the front surface and the reverse surface of the chip assembly 20 by mirror polishing the front surface and the reverse surface of the chip assembly 20. This improves accuracy in forming the circuit patterns 15 on the front surfaces 10C of the chips 10B.

Additionally, the electronic device manufacturing method according to the first embodiment melts the adhesive 30 of the chip assembly 20 to separate the chip assembly 20 into the chips 10E. The chips 10E after pattern formation can thus be easily separated from the chip assembly 20.

Additionally, the electronic device manufacturing method according to the first embodiment forms the chip assembly 20 after performing the aligning step and the bonding step. In addition, in this manufacturing method, after the circuit pattern 15 is formed on the front surface of the chip assembly 20 at the pattern forming step, the adhesive 30 is melted to thereby separate the chip assembly 20 into the chips 10E after pattern formation. This enables mass production of the chips 10E after pattern formation with the burr X removed altogether from the chips 10 without damaging the circuit patterns 15. Thus, a workload involved in the manufacture of the electronic devices can be reduced, while a workload in removing the burr X is reduced, so that manufacturing efficiency of the electronic devices as the chips 10E after pattern formation can be improved.

Additionally, in the electronic device manufacturing method according to the first embodiment, the adhesive 30 is applied in a pinpoint manner to the gap Y between the chips 10B from the front surface 10C side of the chips 10B at the bonding step at which the chip assembly 20 is formed. This allows the amount of the adhesive 30 used for forming the chip assembly 20 to be saved.

Additionally, in the electronic device manufacturing method according to the first embodiment, in the automatic aligning machine 60 used in the bonding step, the height dimension L3 of the partition frame 62A of the compartment 62, in which the chip 10B is housed, is set to a value less than the height dimension of the chip 10B. Thus, by increasing the height dimension L3 of the partition frame 62A, the thickness of the adhesive layer 30A that bonds the chips 10B can be thinned and the amount of the adhesive 30 used to be applied to the gap Y can be saved.

Additionally, in the electronic devices according to the first embodiment, the cut surfaces 10A of the chips 10B before pattern formation are subjected to barrel polishing and the burr X is thereby removed from the cut surfaces 10A. This enables mass production of the electronic devices of the chips 10E after pattern formation from which the burr X is removed.

In the electronic device manufacturing method according to the first embodiment described above, the front surface and the reverse surface of the chip assembly 20 are polished at the mirror polishing step. The mirror polishing step may nonetheless be eliminated, if the adhesive 30 can be applied to the gap Y between the chips 10B from the front surface 10C side of the chip 10B at the bonding step accurately such that the adhesive 30 is not deposited on the front surface 10C of the chip 10B. In addition, in the electronic device manufacturing method according to the first embodiment, both the front surface and the reverse surface of the chip assembly 20 are polished at the mirror polishing step. Mirror polishing may nonetheless be performed only on the surface on which the adhesive 30 is applied.

Additionally, in the electronic device manufacturing method according to the first embodiment, the aligning step using the automatic aligning machine 60 aligns the chips 10B so that the front surfaces 10C of the chips 10B face in the upward direction M1 and the bonding step applies the adhesive 30 to the gap Y between the chips 10B to thereby form the chip assembly 20. The aligning step of Step S13 and the bonding step of Step S14 illustrated in FIG. 1 may, however, be modified as described below. An electronic device manufacturing method with modified aligning and bonding steps will then be described below as a second embodiment of the present invention.

[b] Second Embodiment

Figure 8:
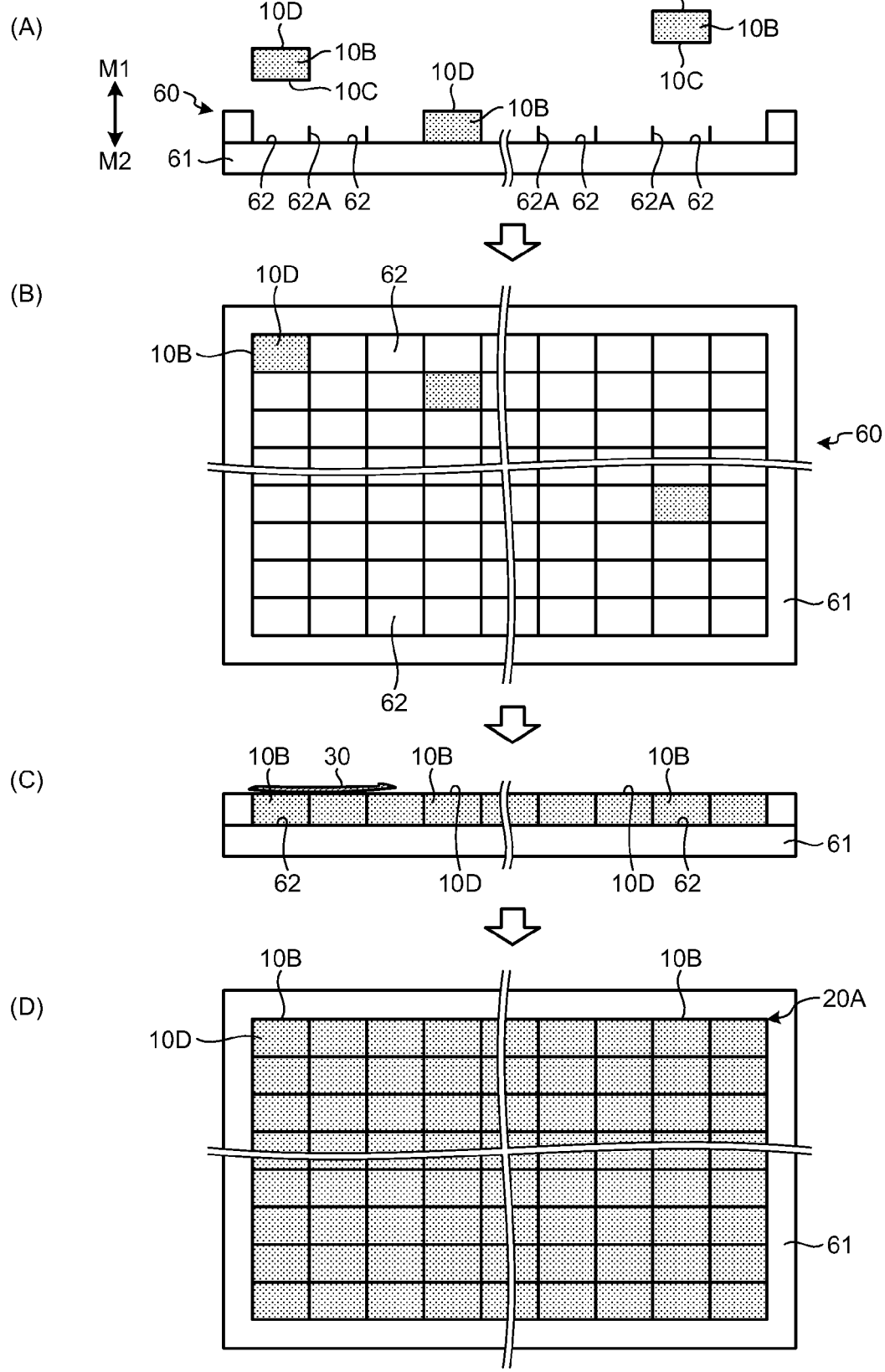
FIG. 8 is a diagram illustrating example steps of aligning and bonding according to a second embodiment.

FIG. 8 is a diagram illustrating example steps of aligning and bonding according to the second embodiment. Like or corresponding configurations are identified by the same reference numerals as those used for the first embodiment of the present invention and descriptions for those will be omitted.

The aligning step in the electronic device manufacturing method according to the second embodiment employs an automatic aligning machine 60 illustrated in FIGS. 8(A) to 8(D) to align the chips 10B so that surfaces opposite to intended surfaces of, for example, front surfaces 10C of the chips 10B, specifically, the reverse surface 10D side face in the upward direction M1. Reference is now made with reference to FIGS. 8(A) and 8(B). For example, when conveying the polished chips 10B onto compartments 62 inside a tray 61, the automatic aligning machine 60 aligns the front surfaces 10C and the reverse surfaces 10D of the chips 10B. The automatic aligning machine 60 then aligns the front surfaces 10C and the reverse surfaces 10D of the chips 10B and houses the chips 10B in the compartments 62 in sequence so that the reverse surfaces 10D of the chips 10B face in the upward direction M1. By housing the chips 10B in the compartments 62 of the tray 61 in sequence so that the reverse surfaces 10D of the chips 10B face in the upward direction M1, the automatic aligning machine 60 aligns the chips 10B so that the reverse surfaces 10D of the chips 10B form a substantially identical plane.

Figure 9:
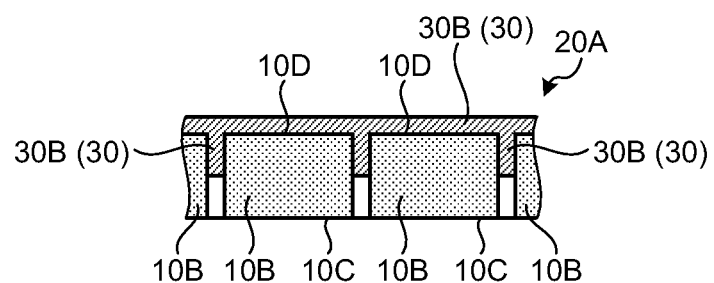
FIG. 9 is a partly cutaway, cross-sectional view illustrating a chip assembly according to the second embodiment.
Figure 10:
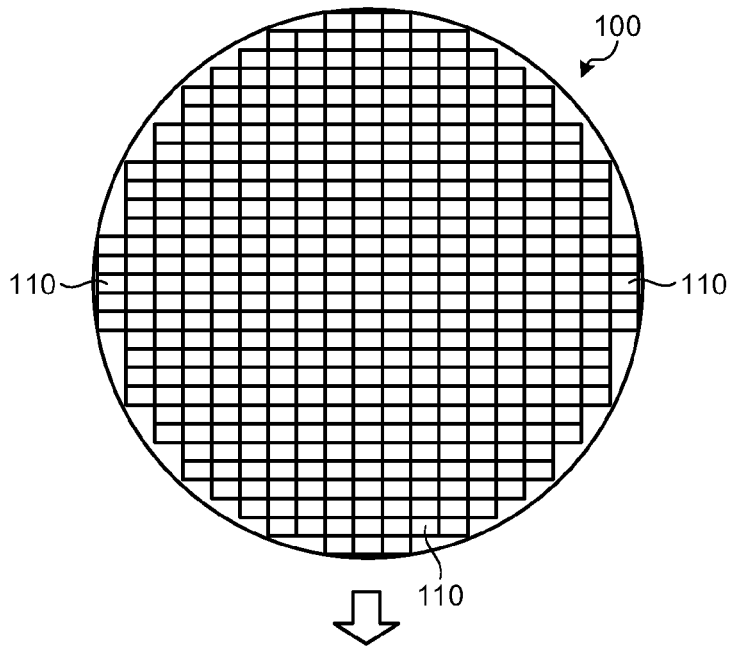
FIG. 10 is a diagram illustrating an example electronic device manufacturing method.
Figure 10:
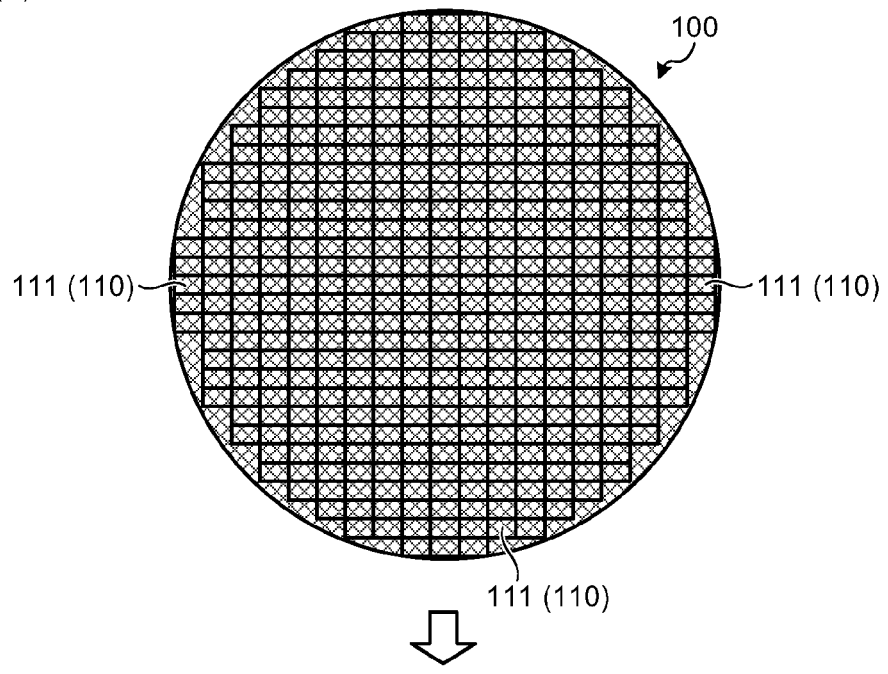
Figure 10:
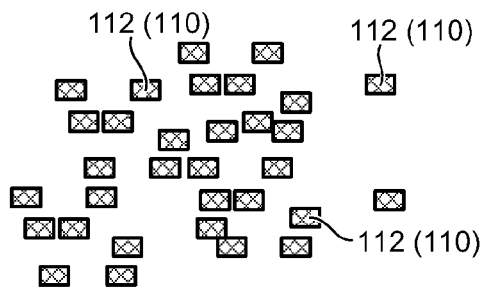
Figure 11:
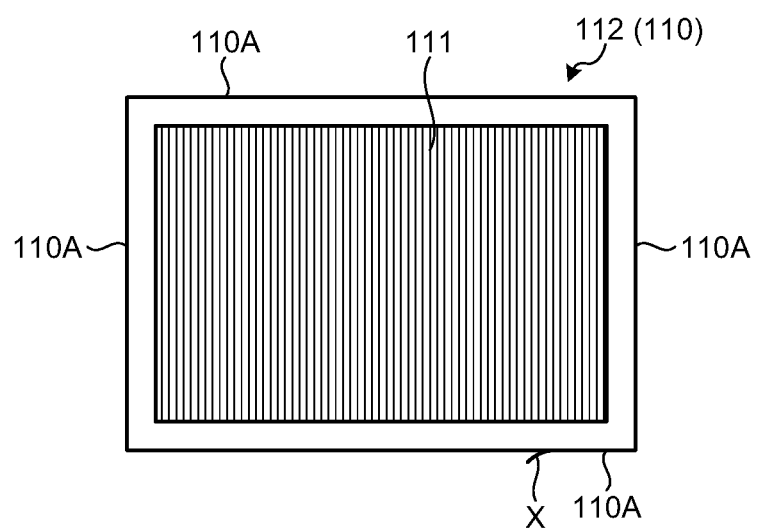
FIG. 11 is a diagram illustrating an example external configuration of an electronic device manufactured according to the manufacturing method illustrated in FIG. 10.

In addition, the bonding step in the electronic device manufacturing method according to the second embodiment employs the automatic aligning machine 60 to apply the adhesive 30 entirely over the chips 10B on the reverse surface 10D side of the chips 10B aligned and housed in all compartments 62 of the tray 61 as illustrated in FIGS. 8(C) and 8(D). The application of the adhesive 30 by the automatic aligning machine 60 entirely over all of the chips 10B allows the adhesive 30 to enter gaps Y between the chips 10B from the reverse surfaces 10D of the chips 10B. This causes the adhesive 30 entering the gaps Y between the chips 10B to bond together cut surfaces 10A of the chips 10B, which forms a chip assembly 20A. FIG. 9 is a partly cutaway, cross-sectional view illustrating the chip assembly 20A according to the second embodiment. As illustrated in FIG. 9, the chip assembly 20A includes an adhesive layer 30B formed on the reverse surfaces 10D of the chips 10B and in the gaps Y between the chips 10B.

As described heretofore, in the electronic device manufacturing method according to the second embodiment, the adhesive 30 is applied to the entire reverse surfaces 10D of the chips 10B that constitute the chip assembly 20A, which causes the adhesive 30 to enter the gaps Y between the chips 10B. Thus, as compared with the bonding step of the first embodiment at which the adhesive 30 is applied in a pinpoint manner to the gaps Y between the chips 10B, a workload requested for the application of the adhesive 30 is reduced, so that work efficiency can be improved. The chip assembly 20A can be removed from the tray 61 through suction or turnover of the tray 61. A pattern is formed on the front surface 10C of the chip assembly 20A removed from the tray.

The manufacturing methods according to the first embodiment and the second embodiment have been exemplarily described for a case in which the wafer 1 is crystal. The manufacturing methods according to the first embodiment and the second embodiment may still be applied to a wafer formed of, for example, lithium niobate ($LiNbO_3$) or lithium tantalate ($LiTaO_3$). Alternatively, the manufacturing methods according to the first embodiment and the second embodiment may even be applied to a wafer 1 formed of silicon, gallium arsenide (GaAs), which is more excellent in high frequency characteristics and is more adaptable for miniaturization than silicon, or various types of wafers.

In the manufacturing methods according to the first embodiment and the second embodiment, a thermoplastic hot melt adhesive is used as the adhesive 30 and the adhesive 30 is melted by heating at the melting temperature of the adhesive 30. Alternatively, an adhesive that can be melted with a chemical agent may be used instead. In this case, the melting step that heats the chips 10E in the chip assembly 20, 20A can be omitted.

In the manufacturing methods according to the first embodiment and the second embodiment, the chip assemblies 20, 20A are formed to include the chips 10B before pattern formation aligned properly. This enables the chips 10B before pattern formation to be transported in the form of the chip assemblies 20, 20A.

In the manufacturing methods according to the first embodiment and the second embodiment, the circuit pattern 15 is formed on each of the chips 10B before pattern formation constituting the chip assemblies 20, 20A and the chip assemblies 20, 20A are formed in which the chips 10E after pattern formation are aligned. This enables the chips 10E after pattern formation to be transported in the form of the chip assemblies 20, 20A.

The polishing step according to the first embodiment and the second embodiment causes the cut chips 10 to be subjected to barrel polishing in one batch. The cut chips 10 may be stacked in a surface direction one on top of another with the cut surfaces 10A aligned and the burr X may then be removed from the cut surfaces 10A by, for example, brushing.

Additionally, the automatic aligning machine 60 employed at the aligning step according to the first embodiment and the second embodiment includes the partition frame 62A that has the height dimension L3 of about half the height dimension of the chip 10B (1 mm), specifically, about 0.5 mm. The height dimension L3 of the partition frame 62A is not, however, limited only to about 0.5 mm; alternatively, the height dimension L3 may be so large as to allow the chip 10B to be positioned inside the compartment 62.

Additionally, the aligning step according to the first embodiment and the second embodiment employs the automatic aligning machine 60 to align the chips 10B that are subjected to barrel polishing. The automatic aligning machine 60 is not necessarily employed as long as the front surfaces 10C and the reverse surfaces 10D of the chips 10B can be properly aligned.

At the bonding step according to the first embodiment, the adhesive 30 is applied in a pinpoint manner to the gap Y from the front surface 10C side of the chips 10B. Alternatively, the chips 10B may be housed in the compartments 62 so that the reverse surfaces 10D of the chips 10B face in the upward direction M1 at the aligning step; then, at the bonding step, the adhesive 30 may be applied in a pinpoint manner to the gap Y between the aligned chips 10B from the reverse surface 10D side, to thereby bond the chips 10B with the adhesive 30.

At the aligning step according to the first embodiment and the second embodiment, the chips 10B before pattern formation that are subjected to barrel polishing are aligned into a rectangular shape as illustrated in FIG. 5(A) to form the chip assembly 20, 20A having the rectangular shape. The resultant shape is not, however, limited only to a rectangle and may take any predetermined shape as long as the chips 10B are properly aligned in the resultant predetermined shape.

The manufacturing methods according to the first embodiment and the second embodiment perform, in sequence, the cutting step of Step S11, the polishing step of Step S12, the aligning step of Step S13, the bonding step of Step S14, the mirror polishing step of Step S15, and the pattern forming step of Step S16. Nonetheless, the circuit pattern 15 may be formed on the front surface 10C of each of the polished chips 10B after the performance of the cutting step of Step S11 and the polishing step of Step S12. Specifically, in this case, the burr X can be removed altogether from the chips 10 without damaging the circuit patterns 15 even without having to perform the aligning step of Step S13, the bonding step of Step S14, and the mirror polishing step of Step S15.

The manufacturing methods according to the first embodiment and the second embodiment described above exemplify the steps of manufacturing the electronic device of the chips 10E on which the SAW filter circuit patterns 15 are formed. The manufacturing methods are, however, applicable to not only the SAW filter, but also to the electronic devices of the chips 10E manufactured through the cutting of the wafer 1 and the forming of the circuit patterns 15 on the cut chips 10.

Specific numeric values specified in the manufacturing methods according to the first embodiment and the second embodiment are only exemplary. Although certain exemplary embodiments have been described as the steps for manufacturing the electronic devices, it shall be understood that they are not the only possible steps and various changes and modifications of the present invention may be made without departing from the technical ideas with which the chips 10 before pattern formation are cut from the wafer 1 and the cut chips 10 are polished to remove the burr X therefrom.

In one aspect of the present invention, burr can be removed altogether from the chips.

All examples and conditional language recited herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A method for manufacturing an electronic device, the method comprising:
   cutting a wafer to obtain chips before pattern formation;
   polishing a cut surface of each of the obtained chips in one batch;
   aligning the polished chips so as to position intended surfaces thereof on which the patterns are to be formed and that face in an identical direction;
   bonding together the cut surfaces of the aligned chips with an adhesive, the bonding including applying the adhesive to gaps between sides of the aligned chips to thereby bond together the cut surfaces of the chips;
   forming a pattern on each intended surfaces of the chips bonded together; and
   melting the adhesive that bonds together the chips, to separate the bonded chips into each of the chips on which the pattern are formed.

2. The method for manufacturing an electronic device according to claim 1, wherein the bonding includes applying the adhesive to surfaces on a side opposite to the intended surfaces of the aligned chips to thereby bond together the cut surfaces of the chips with the adhesive.

3. The method for manufacturing an electronic device according to claim 1, the method further comprising:
   polishing the intended surfaces of the chips bonded together with the adhesive.

4. A chip assembly comprising:
   a plurality of chips obtained from a wafer before pattern formation being cut, the chips each having a cut surface produced by the cutting polished and an intended surface on which a pattern is to be formed, the chips being aligned with each other the intended surfaces that face in an identical direction, the cut surfaces of the aligned chips being bonded to each other with an adhesive being applied to gaps between sides of the aligned chips to thereby bond together the cut surfaces of the chips, the chip assembly being separated into each of the chips by melting and removing the adhesive, the pattern being formed on each intended surfaces of the chips bonded together.

* * * * *